US011320577B2

(12) United States Patent
Lee et al.

(10) Patent No.: US 11,320,577 B2
(45) Date of Patent: May 3, 2022

(54) RADIATION ABSORBING ELEMENT FOR INCREASING COLOR GAMUT OF QUANTUM DOT BASED DISPLAY DEVICES

(71) Applicant: Nanosys, Inc., Milpitas, CA (US)

(72) Inventors: Ernest Lee, Palo Alto, CA (US); Jason Hartlove, Los Altos, CA (US)

(73) Assignee: Nanosys, Inc., Milpitas, CA (US)

( * ) Notice: Subject to any disclaimer, the term of this patent is extended or adjusted under 35 U.S.C. 154(b) by 565 days.

(21) Appl. No.: 15/788,346

(22) Filed: Oct. 19, 2017

(65) Prior Publication Data

US 2018/0120492 A1 May 3, 2018

Related U.S. Application Data

(60) Provisional application No. 62/414,929, filed on Oct. 31, 2016.

(51) Int. Cl.
*F21V 8/00* (2006.01)
*B82Y 30/00* (2011.01)
(Continued)

(52) U.S. Cl.
CPC .............. *G02B 6/005* (2013.01); *B82Y 30/00* (2013.01); *B82Y 40/00* (2013.01); *C09K 11/025* (2013.01); *G02B 6/0055* (2013.01); *G02B 6/0056* (2013.01); *G02B 6/0068* (2013.01); *G02F 1/1336* (2013.01); *G02F 1/133621* (2013.01);
(Continued)

(58) Field of Classification Search
CPC .... G02B 6/005; G02B 6/0055; G02B 6/0056; G02B 6/0068; G02B 6/0096; B82Y 30/00; B82Y 40/00; C09K 11/025; C09K 11/703; C09K 11/883; G02F 1/1336; G02F 1/133621; G02F 1/133603; G02F 1/133615; G02F 2001/133614; G02F 2001/133624;
(Continued)

(56) References Cited

U.S. PATENT DOCUMENTS

| 6,949,206 B2 | 9/2005 | Whiteford et al. |
| 7,267,875 B2 | 9/2007 | Whiteford et al. |

(Continued)

FOREIGN PATENT DOCUMENTS

| CN | 101283454 A | 10/2008 |
| CN | 102980136 A | 3/2013 |

(Continued)

OTHER PUBLICATIONS

Luxottica Exciton P491 data/sales sheet (Year: 2018).*

(Continued)

*Primary Examiner* — George G King
(74) *Attorney, Agent, or Firm* — Sterne, Kessler, Goldstein & Fox P.L.L.C.

(57) ABSTRACT

Embodiments of a display device are described. The display device includes a backlight unit having a light source, a quantum dot film, and a radiation absorbing element. The quantum dot film is optically coupled to the light source and is configured to process light received from the light source. The radiation absorbing element is optically coupled to the quantum dot film and is configured to tune a spectral emission width of the processed light received from the quantum dot film to achieve over 90% color gamut coverage of a standard RGB color space.

19 Claims, 6 Drawing Sheets

(51) Int. Cl.
| | |
|---|---|
| *B82Y 40/00* | (2011.01) |
| *C09K 11/02* | (2006.01) |
| *G02F 1/13357* | (2006.01) |
| *H05B 33/14* | (2006.01) |
| *G02F 1/1335* | (2006.01) |
| *H01L 33/50* | (2010.01) |

(52) U.S. Cl.
CPC ........... *H05B 33/14* (2013.01); *G02B 6/0096* (2013.01); *G02F 1/133603* (2013.01); *G02F 1/133614* (2021.01); *G02F 1/133615* (2013.01); *G02F 1/133624* (2021.01); *G02F 2202/36* (2013.01); *H01L 33/502* (2013.01); *H01L 33/507* (2013.01)

(58) Field of Classification Search
CPC ... G02F 2202/36; H05B 33/14; H01L 33/502; H01L 33/507
See application file for complete search history.

(56) References Cited

U.S. PATENT DOCUMENTS

| | | | |
|---|---|---|---|
| 7,374,807 | B2 | 5/2008 | Parce et al. |
| 7,572,393 | B2 | 8/2009 | Whiteford et al. |
| 7,585,564 | B2 | 9/2009 | Whiteford et al. |
| 7,645,397 | B2 | 1/2010 | Parce et al. |
| 8,283,412 | B2 | 10/2012 | Liu et al. |
| 8,563,133 | B2 | 10/2013 | Whiteford et al. |
| 10,049,627 | B2 * | 8/2018 | Schuck ................ H04N 13/334 |
| 2008/0237540 | A1 | 10/2008 | Dubrow |
| 2010/0110728 | A1 | 5/2010 | Dubrow et al. |
| 2012/0113672 | A1 | 5/2012 | Dubrow et al. |
| 2014/0233105 | A1* | 8/2014 | Schmeder ............. G02C 7/107 359/590 |
| 2015/0048395 | A1 | 2/2015 | Vampola et al. |
| 2015/0339996 | A1 | 11/2015 | Schuck et al. |
| 2016/0307519 | A1 | 10/2016 | Chen et al. |
| 2017/0115529 | A1* | 4/2017 | Kim ...................... G02B 6/0073 |
| 2018/0203302 | A1* | 7/2018 | Kim ...................... H01L 33/501 |
| 2019/0219834 | A1* | 7/2019 | Ace ........................ G02C 7/104 |

FOREIGN PATENT DOCUMENTS

| | | |
|---|---|---|
| CN | 105404046 A | 3/2016 |
| CN | 105974666 A | 9/2016 |
| JP | 2009-251511 A | 10/2009 |
| JP | 2013-544018 A | 12/2013 |
| JP | 2016-500836 A | 1/2016 |
| JP | 2016-509686 A | 3/2016 |
| JP | 2016-046260 A | 4/2016 |
| KR | 2012-0074899 A | 7/2012 |
| WO | WO 2005/022120 | 3/2005 |
| WO | WO-2015/098906 A1 | 7/2015 |

OTHER PUBLICATIONS

Alivisatos, A. P., "Semiconductor Clusters, Nanocrystals, and Quantum Dots," *Science* vol. 271, pp. 933-937 (Feb. 16, 1996).
Murray, C.B. et al., "Synthesis and Characterization of Nearly Monodisperse CdE (E=S, Se, Te) Semiconductor Nanocrystallites," *J. Am. Chem. Soc.*, vol. 116, No. 19, pp. 8706-8715 (Sep. 22, 1993).
Peng, X. et al., "Epitaxial Growth of Highly Luminescent CdSe/CdS Core/Shell Nanocrystals with Photostability and Electronic Accessibility," *J. Am. Chem. Soc.*, vol. 119, No. 30, pp. 7019-7029 (Jul. 30, 1997).
Notification of Transmittal of the International Search Report and Written Opinion, for PCT Appl. No. PCT/US2017/057868, 15 pages, dated Jan. 24, 2018.
Office Action from copending U.S. Appl. No. 16/697,436, filed Nov. 27, 2019, U.S. Patent and Trademark Office, Alexandria, Virginia, dated Sep. 22, 2020.
Patent Search Report, dated Jul. 16, 2021, for Chinese Patent Appl. No. 201780074374.X, 5 pages with translation.
Notification of the First Office Action, dated Jul. 23, 2021, for Chinese Patent Appl. No. 201780074374.X, 17 pages with translation.
Communication pursuant to Article 94(3) EPC, dated Jul. 5, 2021, for European Patent Appl. No. 17794856.9, 14 pages.
Examination report No. 1 for standard patent application, dated Oct. 26, 2021, for Australian Patent Appl. No. 2017350734, 3 pages.
Notice of Reasons for Rejection, dated Sep. 10, 2021, for Japanese Patent Appl. No. 2019-521388, 15 pages with translation.

* cited by examiner

RADIATION ABSORBING ELEMENT FOR INCREASING COLOR GAMUT OF QUANTUM DOT BASED DISPLAY DEVICES

CROSS REFERENCE TO RELATED APPLICATIONS

This application claims the benefit of U.S. Provisional Application No. 62/414,929 filed Oct. 31, 2016, the disclosure of which is incorporated by reference herein in its entirety.

BACKGROUND OF THE INVENTION

Field

The present invention relates to display devices including light-emitting diode (LEDs) based backlight units (BLUs) and phosphor films including luminescent nanostructures such as quantum dots (QDs).

Background

Display devices (e.g., liquid crystal displays (LCDs)) are used as screens or displays for a wide variety of electronic devices and typically require some form of backlighting for images to be visible in normal or reduced ambient light environments. In a BLU of the display device, LEDs are typically utilized as a light source. The LEDs may be arranged in a two dimensional array behind the viewing area of the display device or around the edge or perimeter of the display device. The BLU may also utilize phosphors, such as yttrium-aluminum-garnet (YAG) phosphors.

Luminescent nanostructures represent a class of phosphors often used in configurations where the phosphor may be placed external to the LEDs. Light emanating from the LEDs may be processed through a phosphor film of the display device to produce white light, which may be distributed across a display screen of the display device.

For example, luminescent nanostructures may be embedded in a flexible film/sheet (e.g., quantum dot enhancement film (QDEF®) supplied commercially from 3M Company, St. Paul, Minn. using quantum dots supplied by Nanosys, Inc, Milpitas, Calif.) that may be placed in the display device (see, e.g., U.S. Patent Publication Nos. 2010/0110728 and 2012/0113672, which are incorporated by reference herein in their entirety). QDEF is a registered trademark of Nanosys, Inc.

Figure 1:
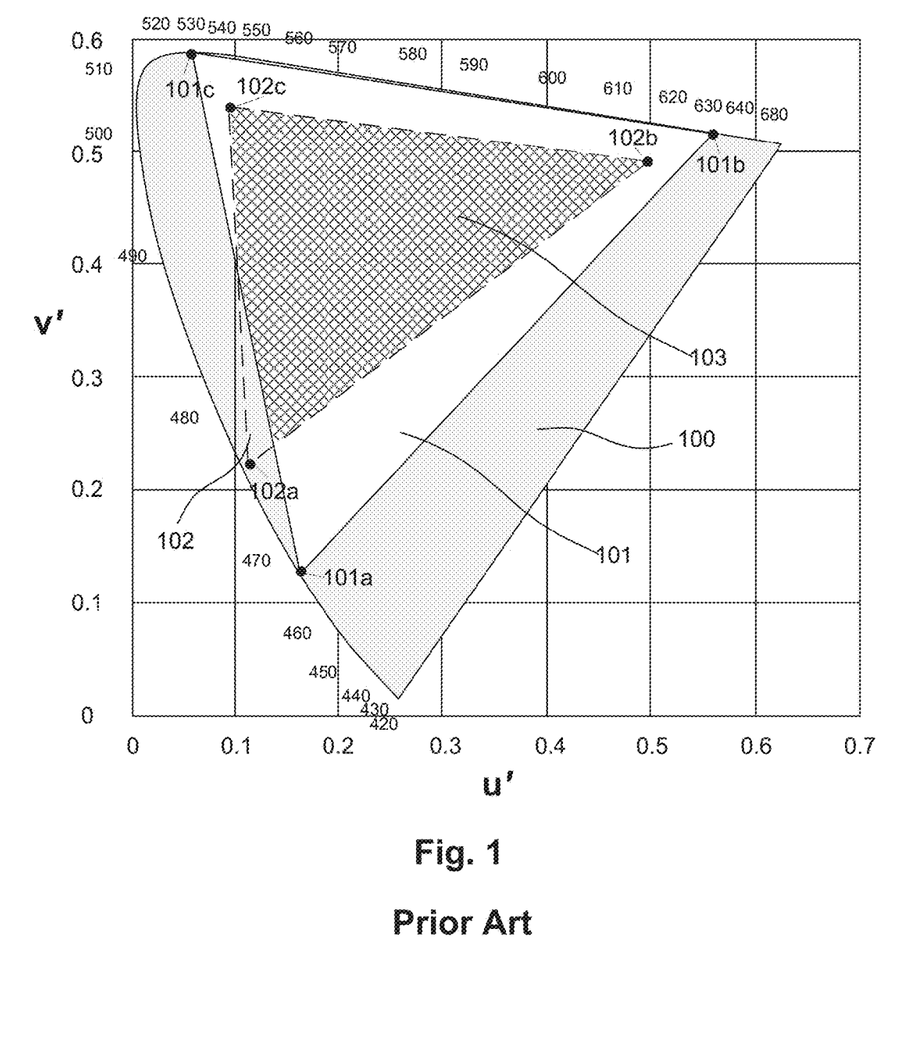
FIG. 1 is a CIE 1976 u'v' chromaticity diagram of Rec. 2020 color gamut and a color gamut of a display device.

One of the factors used to define the image quality of a display device is the color gamut coverage of standard RGB color spaces such as Rec. 2020, Rec. 709, DCI P3, NTSC, or sRGB provided by the display device. FIG. 1 illustrates a definition of color gamut coverage of a display device. In FIG. 1, area 101 formed between 1976 CIE color coordinates 101a-101c represents the color gamut of a standard RGB color space (e.g., Rec. 2020) on the 1976 CIE u'-v' chromaticity diagram 100. Area 102 formed between 1976 CIE color coordinates 102a-102c represents the color gamut of the display device on the 1976 CIE u'-v' chromaticity diagram 100. Color gamut coverage of the display device may be defined as a ratio of the overlapping area 103 between areas 101 and 102 to area 101. The wider the color gamut coverage of a display device allows the display device to render a wider range of colors identifiable by the human eye (i.e., the visible spectrum), and hence, improves the image quality of the display device assuming the other factors contributing to the image quality are optimized.

Current display devices suffer from a trade-off between achieving the desired brightness (e.g., brightness required by high dynamic range (HDR) imaging standards) and the desired color gamut coverage (e.g., greater than 85%) of the standard RGB color spaces. For example, some display devices suffer about 30% loss in brightness to achieve over 90% DCI P3 color gamut coverage. Hence, with current technology, loss of brightness in display devices would be significantly higher in order to achieve color gamut coverage of color spaces that are even wider than DCI P3 (e.g., Rec. 2020).

SUMMARY

Accordingly, there is need for display devices with less of a trade-off between achieving the desired color gamut coverage of the wide RGB color spaces and the desired brightness.

According to an embodiment, a backlight unit (BLU) of a display device includes a light source, a quantum dot film, and a radiation absorbing element. The quantum dot film is optically coupled to the light source and is configured to process light received from the light source. The radiation absorbing element is optically coupled to the quantum dot film and is configured to tune a spectral emission width of the processed light received from the quantum dot film to achieve over 90% color gamut coverage of a standard RGB color space.

According to another embodiment, a display device includes a backlight unit (BLU) and an image generating unit (IGU). The BLU includes an optical cavity having a top side, a bottom side, and side walls, and an array of light sources coupled to the optical cavity. The BLU further includes a quantum dot film that is positioned within the optical cavity and is configured to process light received from the array of light sources. Further included in the BLU is a radiation absorbing element that is positioned within the optical cavity and is configured to tune a spectral emission width of the processed light received from the quantum dot film to achieve over 90% color gamut coverage of the Rec. 2020 color space. The BLU is configured to transmit the tuned light to the IGU.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWGINS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, mobile phones, smart phones, personal digital assistants (PDAs), gaming devices, electronic reading devices, digital cameras, tablets, wearable devices, car navigation systems, and the like.

The term "about" as used herein indicates the value of a given quantity varies by ±10% of the value. For example, "about 100 nm" encompasses a range of sizes from 90 nm to 110 nm, inclusive.

In embodiments, the term "forming a reaction mixture" or "forming a mixture" refers to combining at least two components in a container under conditions suitable for the components to react with one another and form a third component.

In embodiment, the terms "light guide plate," "light guide," and "light guide panel" are used interchangeably and refer to an optical component that is suitable for directing electromagnetic radiation (light) from one position to another.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The terms "luminance" and "brightness" are used herein interchangeably and refer to a photometric measure of a luminous intensity per unit area of a light source or an illuminated surface.

The terms "specular reflectors," "specularly reflective surfaces," and "reflective surfaces" are used herein to refer to elements, materials, and/or surfaces capable of specular reflection.

The term "specular reflection" is used herein to refer to a mirror-like reflection of light (or of other kinds of wave) from a surface, when an incident light hits the surface.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

This disclosure provides various embodiments of QD-based BLUs of display devices that help to improve or eliminate the current existing trade-off between achieving the desired brightness and the desired color gamut in display devices.

Figure 2:
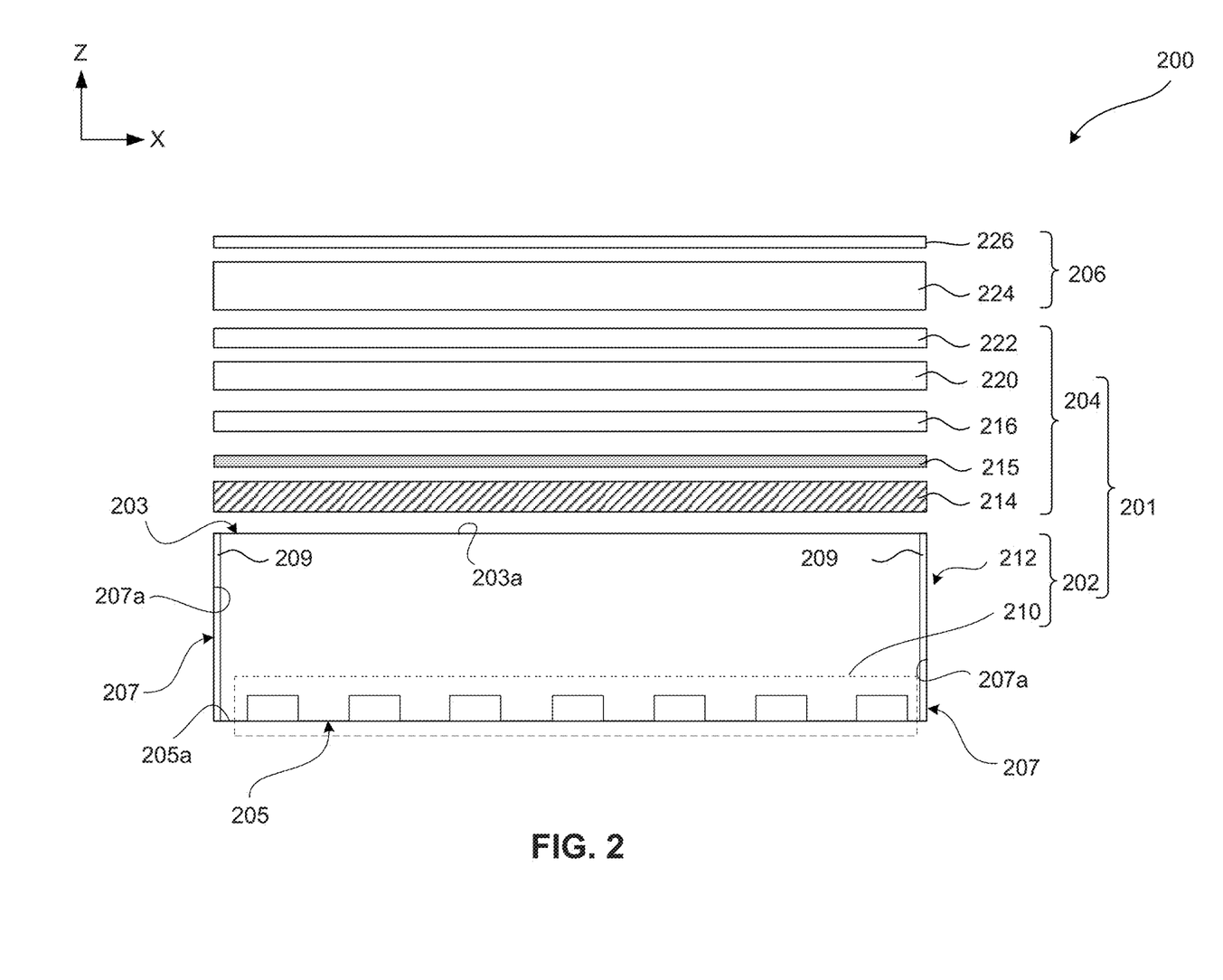
FIGS. 2-3 are exploded cross-sectional views of backlit display devices, according to various embodiments.

Example Embodiments of a Backlit Display Device with Radiation Absorbing Element FIG. 2 illustrates a schematic of an exploded cross-sectional view of a backlit display device 200, according to an embodiment. Display device 200 may include a BLU 201 having a light source unit (LSU) 202, an optical processing unit (OPU) 204, and an image generating unit (IGU) 206.

LSU 202 may include an optical cavity 212 and an array of LEDs 210 (e.g., white LEDs or blue LEDs) coupled to optical cavity 212. Optical cavity 212 may include a top side 203, a bottom side 205, sidewalls 207 and a closed volume confined by top side 203, bottom side 205, and sidewalls 207. LEDs 210 may be coupled to a top surface 205a of bottom side 205 within the closed volume. LEDs 210 may be configured to provide a primary light (e.g., a blue light or a white light) that may be processed through OPU 204 and subsequently, transmitted to IGU 206 to be distributed across a display screen 226 of IGU 206. In some embodiments, LEDs 210 may comprise blue LEDs that emit in the range from about 440 nm to about 470 nm. In some embodiments, LEDs 210 may comprise white LEDs that emit in the range from about 440 nm to about 700 nm or other possible light wavelength ranges. In an embodiment, the array of LEDs 210 may comprise a two-dimensional array of LEDs that are spread across an area of top surface 205a and the area may be equal to the surface area of display screen 226.

It should be noted that even though two sidewalls 207 are shown in FIG. 2, a person skilled in the art would understand that optical cavity 212 may include any number of sidewalls 207, according to various embodiments. For example, optical cavity 212 may have a cuboid shape and may include four sidewalls similar to sidewalls 207. Optical cavity 212 is not restricted to being cuboid in shape or having other straight-sided shapes. Optical cavity 212 may be configured to be any type of geometric shape, such as but not limited to cylindrical, trapezoidal, spherical, or elliptical, according to various embodiments, without departing from the spirit and scope of the present invention. It should also be noted that the rectangular cross-sectional shape of optical cavity 212, as illustrated in FIG. 2, is for illustrative purposes, and is not limiting. Optical cavity 212 may have other cross-sectional shapes (e.g., trapezoid, oblong, rhomboid), according to various embodiments, without departing from the spirit and scope of the present invention.

Top side 203 of optical cavity 212 may be configured to be an optically diffusive and transmissive layer such that light from LEDs 210 may exit optical cavity 212 through top side 203 with a substantially uniform distribution of brightness across top surface 203a of top side 203 and traverse through OPU 204 and/or IGU 206. In an embodiment, top side 203 may include optically transparent areas and optically translucent areas that are strategically arranged over LEDs 210 to provide the substantially uniform distribution in light brightness exiting top side 203. In another embodiment, top side 203 may include pores of varying sizes in diameters and optically translucent areas that are strategically arranged to provide the substantially uniform distribution in light brightness exiting top side 203.

Bottom side 205 and/or sidewalls 207 may be constructed from one or more materials (e.g., metals, non-metals, and/or alloys) that are configured to have specularly reflective top surface 205a and/or specularly reflective side wall interior surfaces 207a, respectively. For example, top surface 205a and/or side wall interior surfaces 207a may be mirror-like surfaces having mirror-like reflection properties. In some embodiments, top surface 205a and/or side wall interior surfaces 207a may be completely specularly reflective or partially specularly reflective and partially scattering.

Optionally, optical cavity 212 may include specular reflectors 209 coupled to sidewall interior surfaces 207a. Specular reflectors 209 may be coupled to sidewall interior surfaces 207a using optically transparent adhesive. The optically transparent adhesive may comprise tape, various glues, polymeric compositions such as silicones, etc. Additional optically transparent adhesive may include various polymers, including, but not limited to, poly(vinyl butyral), poly(vinyl acetate), epoxies, and urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate, and laurylmethacrylate; styrene based polymers; and polymers that are cross linked with difunctional monomers, such as divinylbenzene, according to various examples.

Specularly reflective top surface 205a and side wall interior surfaces 207a and specular reflectors 209 may substantially minimize absorption of light from LEDs 210 through bottom side 205 and/or side walls 207 and thus, substantially minimize loss of luminance within optical cavity 212 and increase light output efficiency of LSU 202.

OPU 204 may be configured to process the light received from LSU 202 to a desired characteristics for transmission to IGU 206. OPU 204 may include, but not limited to, a phosphor film 214, such as the QDEF film mentioned above, a radiation absorbing element 215, a brightness enhancing film (BEF) 216, a diffuser 220, and a reflective polarizing film (RPF) 222. It should be noted that OPU 204 may include more than one diffuser, BEF, and/or RPF without departing from the spirit and scope of the invention, as would be understood by a skilled person in the art.

Phosphor film 214 may be a QDEF including luminescent nanostructures such as QDs (e.g., QD 600 described with reference to FIG. 6). In an example embodiment, phosphor film 214 may include a plurality of luminescent nanostructures that emit at the same wavelength, for example, at the wavelength corresponding to green light or red light in the visible spectrum. In another example embodiment, phosphor film 214 may include a first plurality of luminescent nanostructures that emit at a first wavelength (e.g., wavelength corresponding to green light) and a second plurality of luminescent nanostructures that emit at a second wavelength (e.g., wavelength corresponding to red light) that is different from the first wavelength.

Phosphor film 214 may be a down-converter, where at least a portion of the primary light from optical cavity 212 may be absorbed, for example, by luminescent nanostructures in phosphor film 214 and re-emitted as secondary light having a lower energy or longer wavelength than the primary light. For example, the first plurality of luminescent nanostructures and the second plurality of luminescent nanostructures may absorb a portion of the blue light from optical cavity 212 and be excited to emit green and red secondary lights, respectively. The unabsorbed portion of the blue primary light and the green and red secondary lights may be mixed at a predetermined ratio to produce white light having a desired white point value to be transmitted through IGU 206 and distributed across display screen 226 to serve as a backlight of display device 200.

Radiation absorbing element 215 may be configured to tune the spectral emission widths (also referred as width of emission spectrum) of any processed and/or unprocessed light passing through radiation absorbing element 215 in order to achieve a desired color gamut coverage of display device 200. The term "processed light" as used herein refers to any light emitted from phosphor film 214 and the term "unprocessed light" as used herein refers to any light emitted from LSU 202 that may bypass phosphor film 214 to reach any of the layers/structures overlying phosphor film 214. In some embodiments, radiation absorbing element 215 may be configured to selectively tune the spectral emission widths of light emitted from the first or second plurality of luminescent nanostructures in phosphor film 214 or the unprocessed light from LEDs 210 (e.g., blue light). In some embodiments, radiation absorbing element 215 may be configured to tune the spectral emission widths of light emitted from both the first and second plurality of luminescent nanostructures in phosphor film 214. In some embodiments, radiation absorbing element 215 may be configured to tune the spectral emission widths of light emitted from both the first and second plurality of luminescent nanostructures in phosphor film 214 and from the unprocessed light from LEDs 210.

Tuning of the spectral emission widths may require absorbing one or more wavelengths from the processed and/or unprocessed light to narrow their spectral emission widths to achieve the desired color gamut coverage without significant decrease in brightness. For example, there may be less than 10% (e.g., about 8%, about 5%, about 3%, or about 1%) decrease in brightness due to this tuning process compared to display devices without radiation absorbing element 215. As processed light from phosphor film 214 having QDs typically exhibit narrow spectral emission widths, the tuning process may not require absorption of wide range of wavelengths to achieve the desired color gamut coverage as required in current non-QD based display devices to achieve similar color gamut coverage.

Wide spectral emission width is one of the limitations in current non-QD based display devices (e.g., OLED based display devices, YAG-phosphor based display devices) in achieving wide color gamut coverage of, for example, the Rec. 2020 color space. Use of absorbing elements in current non-QD based display devices may achieve wide color gamut coverage (e.g., 80-90% Rec. 2020 color gamut coverage), but at the cost of significant decrease in brightness. Such decrease in brightness may not only adversely affect the image quality of the current display devices, but also fail to meet the brightness level required under the HDR imaging standards.

Radiation absorbing element 215 may include one or more non-phosphor based materials. That is, the one or more non-phosphor based materials exhibit optical absorption properties, but do not exhibit any optical emission properties. The one or more non-phosphor base materials may be selected based on their optical absorption properties to absorb only the one or more wavelengths or range of wavelengths that require absorbing during the above described tuning process. In some embodiments, the one or more non-phosphor materials may include the same absorption property. In some embodiment, each of the one or more non-phosphor materials includes an absorption property different from each other.

The one or more non-phosphor materials may be selected such that they may be inexpensively disposed on phosphor film 214 or any other layer/structure of display device 200 to form radiation absorbing element 215. For example, the one or more non-phosphor materials may be dye (e.g., narrow band organic Exciton® P491 dye), ink, paint, polymeric material, an/or any material that may be sprayed, painted, spin-coated, printed, or any other suitable low temperature (e.g., below 100° C.) deposition method. Printing may be done using, for example, a plotter, an inkjet printer, or a screen printer. In some embodiments, the one or more non-phosphor materials may be directly disposed on phosphor film 214. In some embodiments, radiation absorbing element 215 may include a substrate having the one or more non-phosphor materials disposed on it.

The placement of radiation absorbing element 215 shown in FIG. 2 is not limiting. It may be placed above or below phosphor film 214. It may be placed below phosphor film 214 and on top surface 203 of optical cavity 212. It may be placed on any layers/structures of BLU 201. For example, radiation absorbing element 215 may be placed on BEF 216 or diffuser 220.

In some embodiments, radiation absorbing element 215 may not be a separate structure as shown in FIG. 2, but may be included in any layers/structures of BLU 201. For example, radiation absorbing element 215 may be a part of phosphor film 214. That is, phosphor film 214 may be a composite film comprising the luminescent nanostructures, as described above, along with radiation absorbing element 215. The one or more non-phosphor materials of radiation absorbing element 215 such as dye, ink, paint, polymeric material, or a combination thereof may be incorporated or embedded in a matrix of phosphor film 214. The one or more non-phosphor materials may include nanostructured materials that may be dispersed in a matrix of phosphor film 214. These nanostructured materials may exhibit optical absorption properties and may not exhibit any optical emission properties. In some embodiments, radiation absorbing element 215 may be included in BEF 216 or diffuser 220. For example, the one or more non-phosphor materials of radiation absorbing element 215 discussed above may be incorporated in the structure of BEF 216 or diffuser 220 described below.

BEF 216 may include reflective and/or refractive films, reflective polarizer films, prism films, groove films, grooved prism films, prisms, pitches, grooves, or any suitable BEFs or brightness enhancement features known in the art. For example, BEF 216 may include conventional BEF such as Vikuiti™ or BEF available from 3M™. According to various embodiments, OPU 204 may include at least one BEF, at least two BEFs, or at least three BEFs. In example embodiments, at least one BEF comprises a reflective polarizer BEF, e.g., for recycling light which would otherwise be absorbed by RPF 222. The brightness-enhancing features and BEF 216 may include reflectors and/or refractors, polarizers, reflective polarizers, light extraction features, light recycling features, or any brightness-enhancing features known in the art. BEF 216 may include a first layer having pitches or prisms having a first pitch angle, according to an embodiment. Additionally or optionally, another BEF (not shown) in OPU 204 may include a second layer having pitches or prisms having a second pitch angle that is different from the first pitch angle.

The brightness-enhancing features of BEF 216 may be configured to reflect a portion of the primary light (e.g., blue light from optical cavity 212) back toward phosphor film 214, thereby providing recycling of the primary light back into phosphor film 214. Because of light recycling, portions of the primary light may pass through phosphor film 214 multiple times before exiting BLU 201. Light transmitted through BEF 216 may be dependent on the angle at which the light is incident upon BEF 216. For example, light traveling upward from optical cavity 212 may transmit through BEF 216 if the light is normal or perpendicular to BEF 216. However, such light may be reflected downward toward optical cavity 212 if the light has a higher angle. BEF 216 may be selected to have multiple reflection angles for light of different angles to achieve a desired recycling of the primary light. Such recycling of the primary light may increase optical path length of the primary light in phosphor film 214, resulting in increased absorption of the primary light and increased re-emission of one or more secondary lights, such as but not limited to green light or red light.

Diffuser 220 is distinct from and supplemental to the scattering features described herein. According to an example of this embodiment, diffuser 220 may include any diffuser film known in the art, including gain diffuser films, and may be disposed above or below BEF 216 or other optical films of display device 200. In example embodiments, phosphor film 214 may eliminate the need for a conventional bottom diffuser (not shown), thereby minimizing the thickness of BLU 201. The compositions of phosphor film 214 may also include one or more scattering or diffuser features associated therewith, which may serve the purpose of traditional diffusers in addition to increasing secondary emission of luminescent nanostructures in phosphor film 214.

IGU 206 may include an LCD module 224 and display screen 226 and may be configured to generate images on display screen 226. Display screen 226 may be a touch screen display, according to an example embodiment. In some embodiments, radiation absorbing element 215 may be placed on or within any layers/structures of IGU 206. For example, radiation absorbing element 215 may be placed on or within LCD module 224.

Display device 200 may further comprise one or more medium materials (not shown) disposed between any of the adjacent elements in display device 200, for example between optical cavity 212 and phosphor film 214; between radiation absorbing element 215; between phosphor film 214 and BEF 216, diffuser 220, RPF 222, or other features; or between any other elements of display device 200. The one or more medium materials may include, but not limited to, a vacuum, air, gas, optical materials, adhesives, optical adhesives, glass, polymers, solids, liquids, gels, cured materials, optical coupling materials, index-matching or index-mismatching materials, index-gradient materials, cladding or anti-cladding materials, spacers, epoxy, silica gel, silicones, brightness-enhancing materials, scattering or diffuser materials, reflective or anti-reflective materials, wavelength-selective materials, wavelength-selective anti-reflective materials, color filters, or other suitable medium material known in the art. Medium materials may also include optically transparent, non-yellowing, pressure-sensitive optical adhesives. Suitable materials include silicones, silicone gels, silica gel, epoxies (e.g., Loctite™ Epoxy E-30CL), acrylates (e.g., 3M™ Adhesive 2175). The one or more medium materials may be applied as a curable gel or liquid and cured during or after deposition, or pre-formed and pre-cured prior to deposition. Curing methods may include UV curing, thermal curing, chemical curing, or other suitable curing methods known in the art. Index-matching medium materials may be chosen to minimize optical losses between elements of BLU 201.

Display device 200 may be any type of geometric shape, such as but not limited to cylindrical, trapezoidal, spherical, or elliptical, according to various embodiments, without departing from the spirit and scope of the present invention. Display device 200 is not restricted to being cuboid in shape or having other straight-sided shapes. It should be noted that the rectangular cross-sectional shape of display device 200 is for illustrative purposes, and is not limiting. Display device 200 may have other cross-sectional shapes (e.g., trapezoid, oblong, rhomboid), according to various embodiments, without departing from the spirit and scope of the present invention. It should also be noted that even though optical cavity 212, phosphor film 214, radiation absorbing element 215, BEF 216, diffuser 220, RPF 222, LCD module 224, and display screen 226 are shown in FIG. 2 to have similar dimensions along X direction, a person skilled in the art would understand that each of these components may have dimensions different from each other in one or more directions, according to various embodiments.

Figure 3:
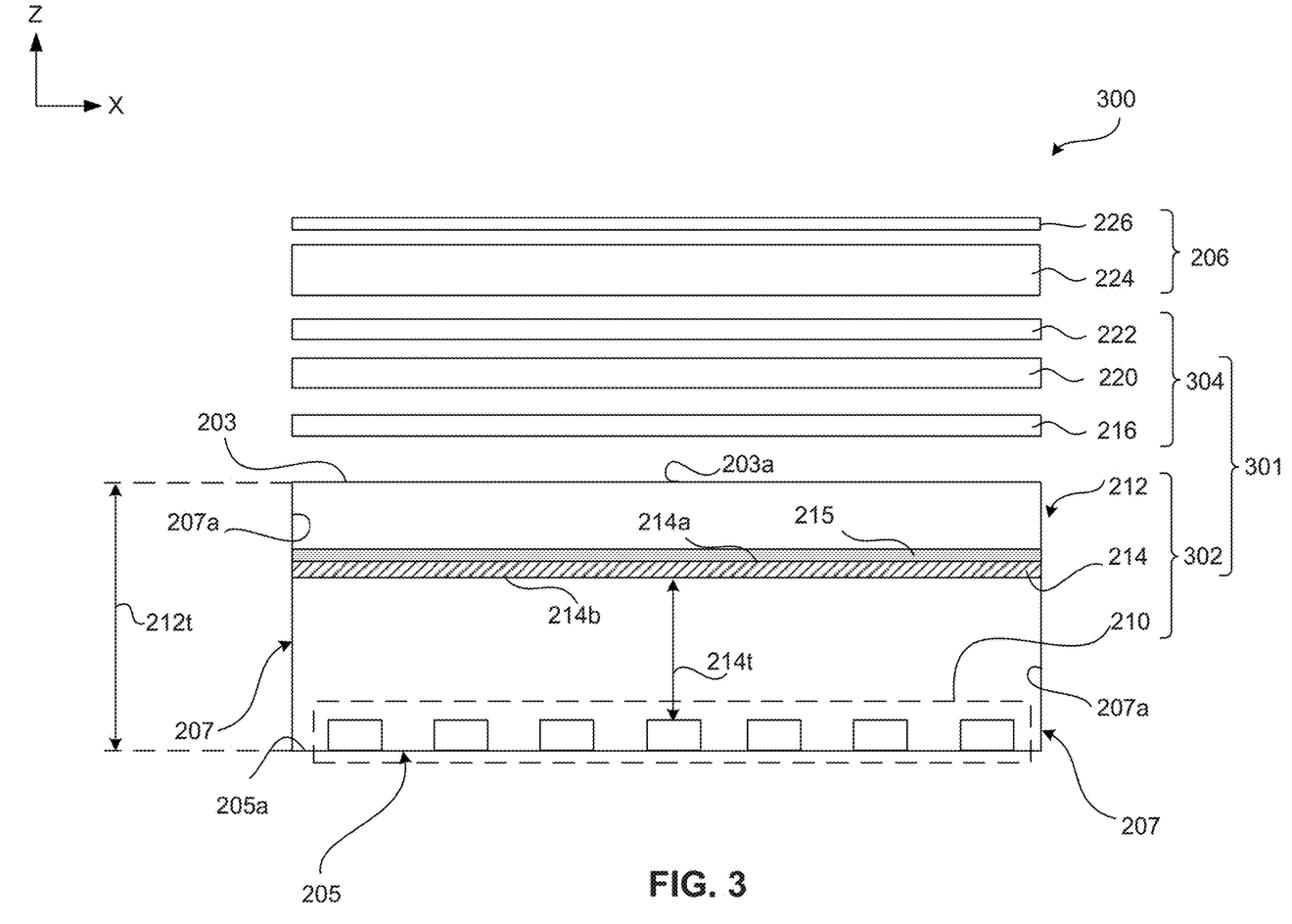

FIG. 3 illustrates a schematic of an exploded cross-sectional view of a backlit display device 300, according to an embodiment. Display device 300 may be similar to display device 200 in structure, composition, and function except for the differences described below.

Display device 300 may include a BLU 301 having a LSU 302, an OPU 304, and IGU 206. LSU 302 may include optical cavity 212, array of LEDs 210 (e.g., white LEDs or blue LEDs) coupled to optical cavity 212, phosphor film 214, and radiation absorbing element 215.

Phosphor film 214 may be placed within the closed volume of optical cavity 212. In an embodiment, phosphor film 214 may be coupled to sidewalls 207 using optically transparent adhesive, mechanical fasteners, or any other fastening mechanism. The position of phosphor film 214 within optical cavity 212, for example, distance 214t between array of LEDs 210 and phosphor film 214 may depend on thickness 212t of optical cavity 212 and/or optical diffusivity of top side 203. In an example embodiment, distance 214t may range from about 20 mm to about 30 mm for a thickness 212t of optical cavity 212 ranging from about 30 mm to about 40 mm.

The placement of phosphor film 214 within optical cavity 212 may allow display device 300 to produce a white point value, of the light distributed across display screen 226, substantially similar to the white point value of current display devices by using a smaller QD population size in phosphor film 214 than the QD population size in phosphor films placed outside optical cavities. The ability to reduce QD population size in phosphor films by placing them within optical cavities to obtain white point values that may be comparable to current display devices increases the range of white point values that may be achieved in display devices. Such reduction may also help to lower the cost of phosphor films in display devices.

Further shown in FIG. 3, radiation absorbing film 215 may be disposed on phosphor film 214 within optical cavity 212. But, this placement of radiation absorbing element 215 is not limiting. It may be placed in the volume between phosphor film 214 and LEDs 210. In some embodiments, radiation absorbing element 215 may be coupled to sidewalls 207 using optically transparent adhesive, mechanical fasteners, or any other fastening mechanism. The optically transparent adhesive may comprise tape, various glues, polymeric compositions such as silicones, etc., placed between phosphor film 214 and sidewalls 207. Additional optically transparent adhesive may include various polymers, including, but not limited to, poly(vinyl butyral), poly(vinyl acetate), epoxies, and urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate, and laurylmethacrylate; styrene based polymers; and polymers that are cross linked with difunctional monomers, such as divinylbenzene, according to various examples.

Figure 4:
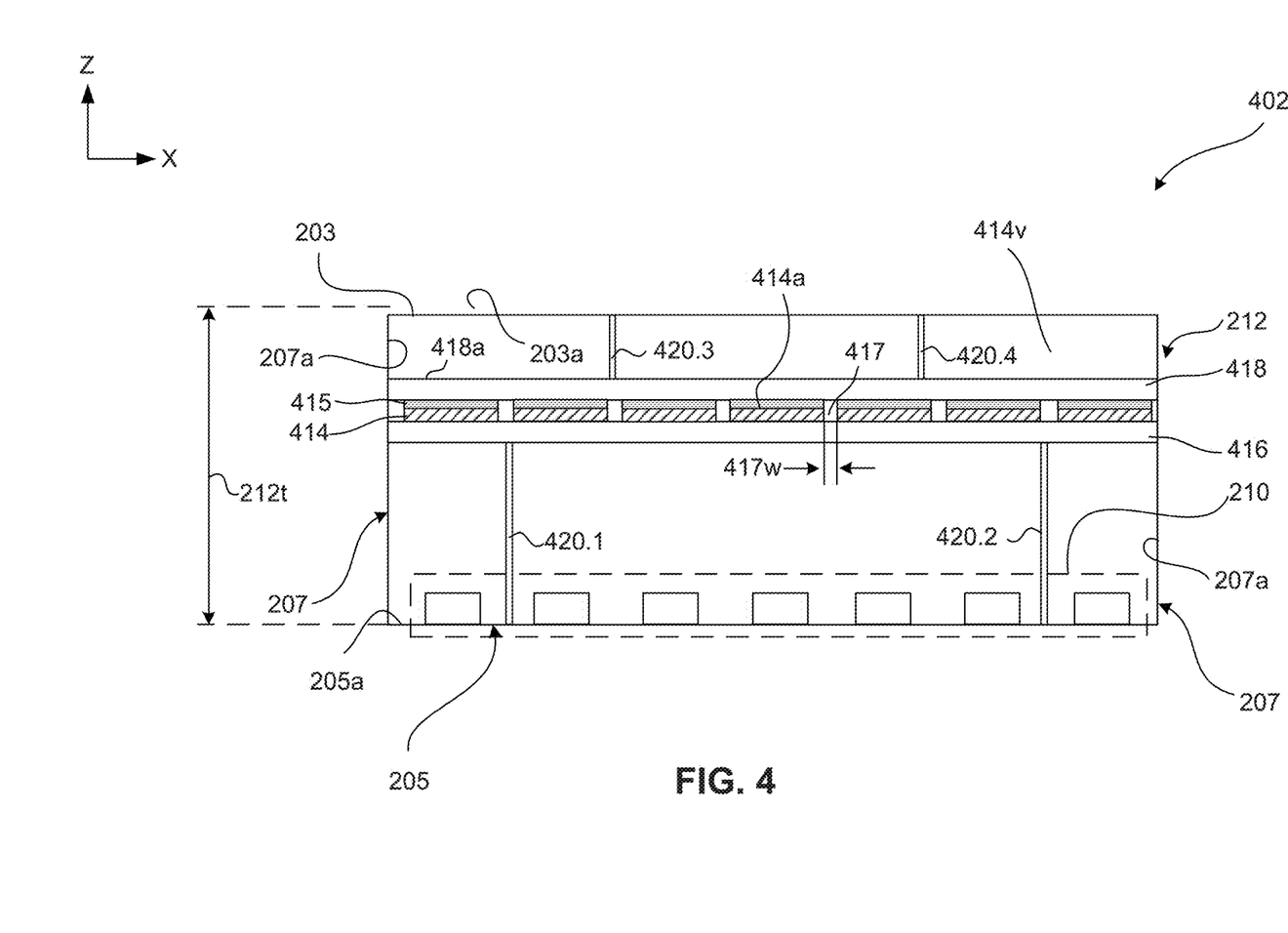
FIG. 4 is a schematic of a cross-sectional view of a light source unit of a backlit display device, according to an embodiment.

FIG. 4 illustrates a schematic of a cross-sectional view of an LSU 402, according to an embodiment. LSU 402 can be implemented as a part of display devices 200 or 300, according to an example of this embodiment. LSU 402 may be similar to LSU 202 and 302 in structure and function except for the differences described below.

LSU 402 may include an array of phosphor films 414 and an array of radiation absorbing elements 415 placed within the closed volume of optical cavity 212. Each of radiation absorbing element of the array of radiation absorbing element 415 may be disposed on respective one of phosphor film of the array of phosphor films 414. Each of radiation absorbing element of the array of radiation absorbing element 415 may be similar to radiation absorbing element 215 in structure, composition, and function. Each of the phosphor film of the array of phosphor films 414 may be spaced from each other by a gap of 417 along X and/or Y direction. Each of the phosphor films 414 may be similar to phosphor films 214 in structure, composition, and function but may be smaller in dimension along, for example, X and/or Y direction compared to phosphor film 214. In an embodiment, each row of array of phosphor films 414 may be arranged to be substantially aligned with a corresponding row of array of LEDs 210. In another embodiment, each of the phosphor films 414 may have a dimension along Y direction large enough to cover the corresponding row of array of LEDs 210 along Y direction. Each of radiation absorbing element of the array of radiation absorbing element 415 may be similar in dimension to the respective one of the phosphor film that it is disposed on.

Using array of phosphor films 414, instead of a single phosphor film (e.g., phosphor film 214), to cover an area equal to the surface area of a display screen (e.g., display screen 226), may help to reduce manufacturing costs of phosphor films, overcome phosphor film size limitations for large display screens, and/or improve production yield by producing substantially defect-free smaller phosphor films and consequently, improve yield of display devices.

The position of array of phosphor films 414 within optical cavity 212 may depend on width 417w of gap 417. Larger the width 417w, farther away from top side 203 the array of phosphor films 414 and the array of radiation absorbing elements 415 may be placed within optical cavity 212, and larger a volume 414v between the array of phosphor films 414 and top side 203 may be provided. In an example, the array of phosphor films 414 may be placed 10 mm below top side 203 for width 417w of about 3 mm.

LSU 402 may further include a first plate 416 configured to support the array of phosphor films 414 and the array of radiation absorbing elements 415 within optical cavity 212. Bottom surface of the array of phosphor films 414 may be in substantial contact with first plate 416. In some embodiments, LSU 402 may further include support posts 420.1 and 420.2, mechanical fasteners, and/or any other fastening mechanism to hold first plate 416 in position within optical cavity 212. Optionally, LSU 402 may include a second plate 418 positioned on top of the array of radiation absorbing elements 415 and coupled to the array of radiation absorbing elements 415 using optically transparent adhesive, mechanical fasteners, and/or any other fastening mechanism. Support posts 420.3 and 420.4, mechanical fasteners, and/or any other fastening mechanism may also be included in LSU 402 to hold second plate 418 in position within optical cavity 212. In some embodiments, support posts 420.1 through 420.4 may be partially or completely optically transparent. In some embodiments, support posts 420.1 through 420.4 may have scattering and/or specularly reflective surfaces.

It should be noted that even though four support posts 420.1 through 420.4 are shown in FIG. 4, a person skilled in the art would understand that optical cavity 212 may include any number of support posts, according to various embodiments.

First plate 416 may be configured to be optically transmissive such that light from array of LEDs 210 are transmitted to the array of phosphor films 414. Additionally or optionally, first plate 416 may be configured to be optically diffusive such that substantially uniform distribution of light from array of LEDs 210 is received across the array of phosphor films 414. Such uniform distribution of light may help to reduce peak light flux received by phosphor films 414 and maximize performance, integrity, and lifetime of phosphor film 414.

Second plate 418 may be configured to be optically transmissive and diffusive such that tuned light from the array of radiation absorbing elements 415 may pass through second plate 418 with a substantially uniform distribution of brightness across second plate top surface 418a. In some embodiments, second plate 418 may include optically transparent areas and optically translucent areas or pores of varying sizes in diameters and optically translucent areas that are strategically arranged to provide such optically diffusivity in second plate 418.

In some embodiments, radiation absorbing elements 415 may be disposed between phosphor films 414 and first plate 416. In some embodiments radiation absorbing elements 415 may be disposed on top surface 418a of second plate 418.

Figure 5:
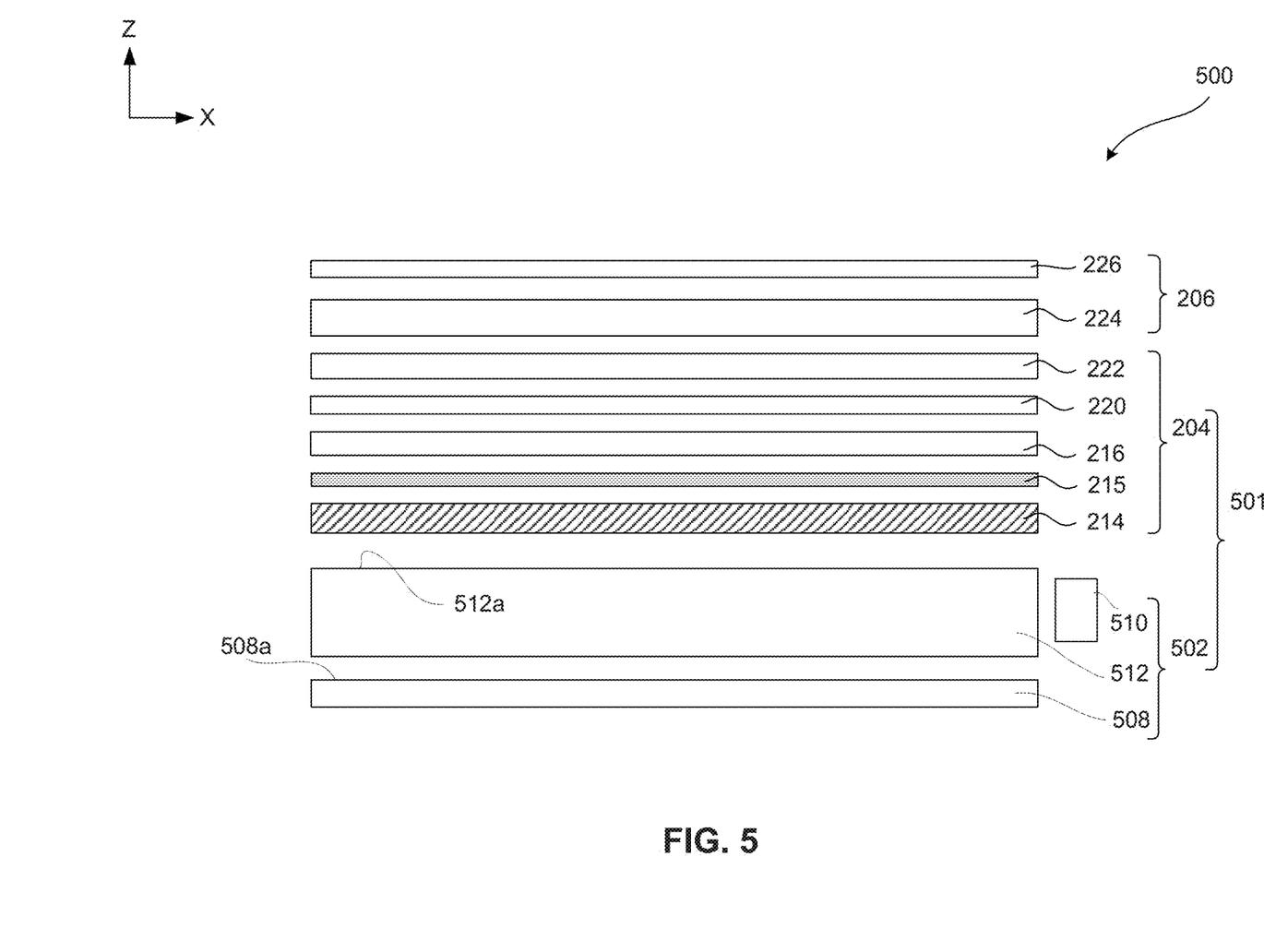
FIG. 5 is schematic of a cross-sectional view of an edge-lit display device, according to an embodiment.

Example Embodiments of an Edge-Lit Display Device with Radiation Absorbing Element FIG. 5 illustrates a schematic of an exploded cross-sectional view of an edge-lit display device 500, according to an embodiment. Display device 500 may include a BLU 501 having a light source unit (LSU) 502. Similar to display device 200, display device 500 may further include OPU 204 and IGU 206. The differences between display devices 200 and 500 are described below.

LSU 502 may include an LED 510 (e.g., a blue LED), an LGP 512, and a reflector 508. LSU 502 may be configured to provide a primary light (e.g., a blue light) that may be processed through OPU 204 and subsequently, transmitted to IGU 206 to be distributed across a display screen 226. The blue LED may emit in the range from about 440 nm to about 470 nm. According to an embodiment, the blue LED may be, for example, a GaN LED that emits blue light at a wavelength of 450 nm.

LGP 512 may include fiber optic cables, polymeric or glass solid bodies such as plates, films, containers, or other structures, according to various examples of this embodiment. The size of LGP 512 may depend on the ultimate application and characteristics of LED 510. The thickness of LGP 512 may be compatible with thickness of LED 510. The other dimensions of LGP 512 may be designed to extend beyond the dimensions of LED 510, and may be on the order of 10's of millimeters, to 10's to 100's of centimeters.

According to various examples of this embodiment, the materials of LGP 512 may include polycarbonate (PC), poly methyl methacrylate (PMMA), methyl methacrylate, styrene, acrylic polymer resin, glass, or any suitable LGP materials known in the art. Suitable manufacturing methods for LGP 512 may include injection molding, extrusion, or other suitable embodiments known in the art. According to an example of this embodiment, LGP 512 may be configured to provide uniform primary light emission, such that primary light entering OPU 504 may be of uniform color and brightness. LGP 512 may include any thickness or shape known in the art. For example, thickness of LGP 512 may be uniform over the entire LGP 512 surface. Alternatively, LGP 512 may have a wedge-like shape.

LGP 512 may be optically coupled to LED 510 and may be physically connected or disconnected to LED 510, according to various examples of this embodiment. For physically connecting LGP 512 to LED 510, optically transparent adhesive may be used (not shown). In further embodiments, LGP 512 may be physically connected to LED 510, for example, by utilizing a polymeric LGP 512, that when heated melts or deforms such that LED 510 may be contacted to LGP 512 it cools, thereby facilitating the formation of a physical adhesion or contact between the two elements.

Alternatively, LSU 502 may include an array of LEDs (not shown), each of which may be similar to LED 510 in structure and function. The array of LEDs may be configured to provide the primary light to the OPU 204 for processing and for subsequent transmission to IGU 206 as discussed above with reference to FIG. 2.

In a further embodiment, reflector 508 may be configured to increase the amount of light that is emitted from LGP 512. Reflector 508 may comprise any suitable material, such as a reflective mirror, a film of reflector particles, a reflective metal film, or any suitable conventional reflectors. In an example embodiment, reflector 108 may include a white film. In certain embodiments, reflector 508 may comprise additional functionality or features, such as scattering, diffuser, or brightness-enhancing features.

The placement of radiation absorbing element 215 in FIG. 5 is not limiting. In some embodiments, it may be placed above or below phosphor film 214. In some embodiments, it may be placed below phosphor film 214 and on top surface 512*a* of LGP 512. In some embodiments, it may be placed on any layers/structures of BLU 201 and/or IGU 206. For example, it may be placed on top surface 508*a* of reflector 508, on BEF 215, diffuser 220, or LCD module 224. In some embodiments, radiation absorbing element 215 may be placed within LGP 512 or LCD module 224.

An Example Embodiment of a Barrier Layer Coated QD

Figure 6:
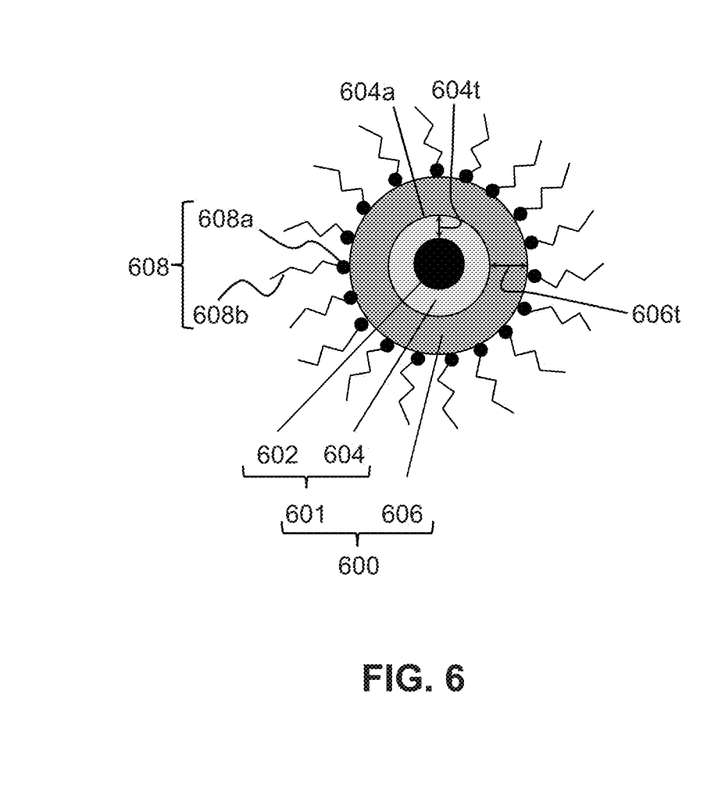
FIG. 6 is a schematic of a cross-sectional view of a barrier layer coated QD, according to an embodiment.

FIG. 6 illustrates a cross-sectional structure of a barrier layer coated QD 100, according to an embodiment. In an embodiment, a population of QD 100 may be included in phosphor films 214 and 414. In some embodiments, the first plurality of luminescent nanostructures of phosphor films 214 and 414 may include a first population of QD 100 that emits at the first wavelength (e.g., wavelength corresponding to green light) and the second plurality of luminescent nanostructures of phosphor films 214 and 414 may include a second population of QD 100 that emits at the second wavelength (e.g., wavelength corresponding to red light).

Barrier layer coated QD 600 includes a QD 601 and a barrier layer 606. QD 601 includes a core 602 and a shell 604. Core 602 includes a semiconducting material that emits light upon absorption of higher energies. Examples of the semiconducting material for core 602 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 602 may also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 602 may improve structural and optical stability and QY of QD 601 compared to undoped QDs.

Core 602 may have a size of less than 20 nm in diameter, according to an embodiment. In another embodiment, core 602 may have a size between about 1 nm and about 5 nm in diameter. The ability to tailor the size of core 602, and consequently the size of QD 601 in the nanometer range enables photoemission coverage in the entire optical spectrum. In general, the larger QDs emit light towards the red end of the spectrum, while smaller QDs emit light towards the blue end of the spectrum. This effect arises as larger QDs have energy levels that are more closely spaced than the smaller QDs. This allows the QD to absorb photons containing less energy, i.e. those closer to the red end of the spectrum.

Shell 604 surrounds core 602 and is disposed on outer surface of core 602. Shell 604 may include cadmium sulfide (CdS), zinc cadmium sulfide (ZnCdS), zinc selenide sulfide (ZnSeS), and zinc sulfide (ZnS). In an embodiment, shell 604 may have a thickness 604*t*, for example, one or more monolayers. In other embodiments, shell 604 may have a thickness 604*t* between about 1 nm and about 5 nm. Shell 604 may be utilized to help reduce the lattice mismatch with core 602 and improve the QY of QD 601. Shell 604 may also help to passivate and remove surface trap states, such as dangling bonds, on core 602 to increase QY of QD 601. The presence of surface trap states may provide non-radiative recombination centers and contribute to lowered emission efficiency of QD 601.

In alternate embodiments, QD 601 may include a second shell disposed on shell 604, or more than two shells surrounding core 602, without departing from the spirit and scope of the present invention. In an embodiment, the second shell may be on the order of two monolayers thick and is typically, though not required, also a semiconducting material. Second shell may provide protection to core 602. Second shell material may be zinc sulfide (ZnS), although other materials may be used as well without deviating from the scope or spirit of the invention.

Barrier layer 606 is configured to form a coating on QD 601. In an embodiment, barrier layer 606 is disposed on and in substantial contact with outer surface 604*a* of shell 604. In embodiments of QD 601 having one or more shells, barrier layer 606 may be disposed on and in substantial contact with the outermost shell of QD 601. In an example embodiment, barrier layer 606 is configured to act as a spacer between QD 601 and one or more QDs in, for example, a solution, a composition, and/or a film having a plurality of QDs, where the plurality of QDs may be similar to QD 601 and/or barrier layer coated QD 600. In such QD solutions, QD compositions, and/or QD films, barrier layer 606 may help to prevent aggregation of QD 601 with adjacent QDs. Aggregation of QD 601 with adjacent QDs may lead to increase in size of QD 601 and consequent reduction or quenching in the optical emission properties of the aggregated QD (not shown) including QD 601. In further embodiments, barrier layer 606 provides protection to QD 601 from, for example, moisture, air, and/or harsh environments (e.g., high temperatures and chemicals used during lithographic processing of QDs and/or during manufacturing process of QD based devices) that may adversely affect the structural and optical properties of QD 601.

Barrier layer 606 includes one or more materials that are amorphous, optically transparent and/or electrically inactive. Suitable barrier layers include inorganic materials, such as, but not limited to, inorganic oxides and/or nitrides. Examples of materials for barrier layer 606 include oxides and/or nitrides of Al, Ba, Ca, Mg, Ni, Si, Ti, or Zr, according to various embodiments. Barrier layer 606 may have a thickness 606*t* ranging from about 8 nm to about 15 nm in various embodiments.

As illustrated in FIG. 6, barrier layer coated QD 600 may additionally or optionally include a plurality of ligands or surfactants 608, according to an embodiment. Ligands or surfactants 608 may be adsorbed or bound to an outer surface of barrier layer coated QD 600, such as on an outer surface of barrier layer 606, according to an embodiment. The plurality of ligands or surfactants 608 may include hydrophilic or polar heads 608a and hydrophobic or non-polar tails 608b. The hydrophilic or polar heads 608a may be bound to barrier layer 606. The presence of ligands or surfactants 608 may help to separate QD 600 and/or QD 601 from other QDs in, for example, a solution, a composition, and/or a film during their formation. If the QDs are allowed to aggregate during their formation, the quantum efficiency of QDs such as QD 600 and/or QD 601 may drop. Ligands or surfactants 608 may also be used to impart certain properties to barrier layer coated QD 600, such as hydrophobicity to provide miscibility in non-polar solvents, or to provide reaction sites (e.g., reverse micellar systems) for other compounds to bind.

A wide variety of ligands exist that may be used as ligands 608. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 608. Nonionic surfactants may be used as surfactants 608 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 608 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, QDs 601 and/or 600 may be synthesized to emit light in one or more various color ranges, such as red, orange, and/or yellow range. In some embodiments, QDs 601 and/or 600 may be synthesized to emit light in the green and/or yellow range. In some embodiments, QDs 601 and/or 600 may be synthesized emit light in the blue, indigo, violet, and/or ultra-violet range. In some embodiments, QDs 601 and/or 600 may be synthesized to have a primary emission peak wavelength between about 605 nm and about 650 nm, between about 510 nm and about 550 nm, or between about 300 nm and about 480 nm.

QDs 601 and/or 600 may be synthesized to display a high QY. In some embodiments, QDs 601 and/or 600 may be synthesized to display a QY between 80% and 95% or between 85% and 90%.

Thus, according to various embodiments, QDs 600 may be synthesized such that the presence of barrier layer 606 on QDs 601 does not substantially change or quench the optical emission properties of QDs 601.

An Example Embodiment of a QD Film

Figure 7:
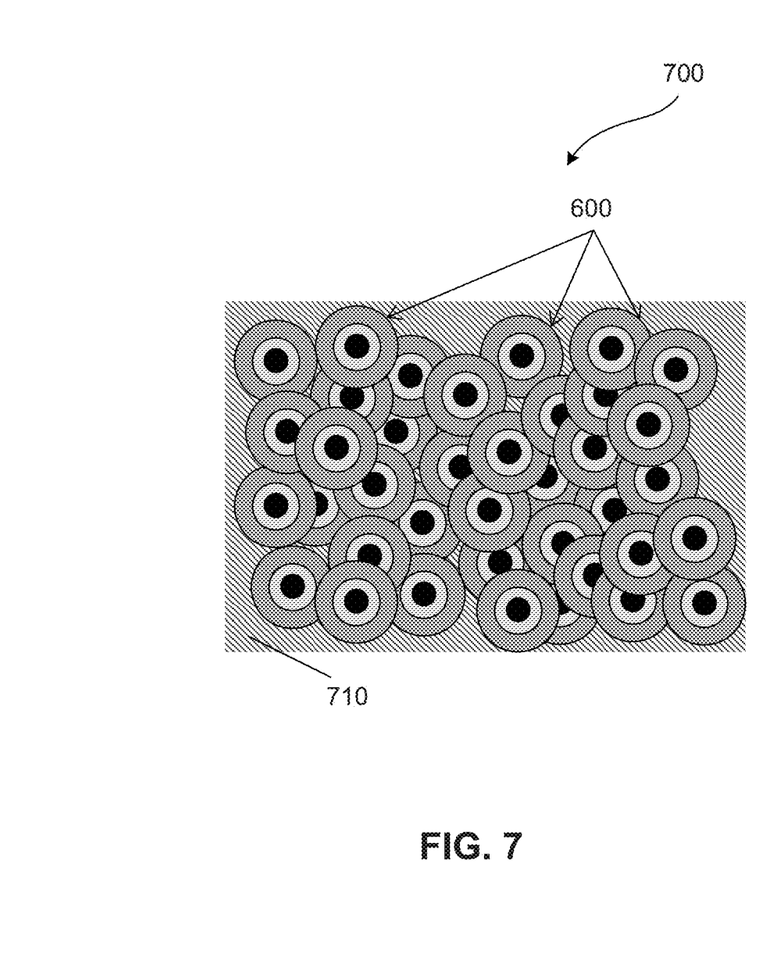
FIG. 7 is a schematic of a barrier layer coated QD film, according to an embodiment.

FIG. 7 illustrates a cross-sectional view of a QD film 700, according to an embodiment. In some embodiments, phosphor films 214 and/or 414 may be similar to QD film 700.

QD film 700 may include a plurality of barrier layer coated core-shell QDs 600 (FIG. 6) and a matrix material 710, according to an embodiment. QDs 600 may be embedded or otherwise disposed in matrix material 710, according to some embodiments. As used herein, the term "embedded" is used to indicate that the QDs are enclosed or encased within matrix material 710 that makes up the majority component of the matrix. It should be noted that QDs 600 may be uniformly distributed throughout matrix material 710 in an embodiment, though in other embodiments QDs 600 may be distributed according to an application-specific uniformity distribution function. It should be noted that even though QDs 600 are shown to have the same size in diameter, a person skilled in the art would understand that QDs 600 may have a size distribution.

In an embodiment, QDs 600 may include a homogenous population of QDs having sizes that emit in the blue visible wavelength spectrum, in the green visible wavelength spectrum, or in the red visible wavelength spectrum. In other embodiments, QDs 600 may include a first population of QDs having sizes that emit in the blue visible wavelength spectrum, a second population of QDs having sizes that emit in the green visible wavelength spectrum, and a third population of QDs that emit in the red visible wavelength spectrum.

Matrix material 710 may be any suitable host matrix material capable of housing QDs 600. Suitable matrix materials may be chemically and optically compatible with QDs 600 and any surrounding packaging materials or layers used in applying QD film 700 to devices. Suitable matrix materials may include non-yellowing optical materials which are transparent to both the primary and secondary light, thereby allowing for both primary and secondary light to transmit through the matrix material. In an embodiment, matrix material 710 may completely surround each of the QDs 600. The matrix material 710 may be flexible in applications where a flexible or moldable QD film 700 is desired. Alternatively, matrix material 710 may include a high-strength, non-flexible material.

Matrix material 710 may include polymers and organic and inorganic oxides. Suitable polymers for use in matrix material 710 may be any polymer known to the ordinarily skilled artisan that can be used for such a purpose. The polymer may be substantially translucent or substantially transparent. Matrix material 710 may include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 710 includes scattering microbeads such as TiO2 microbeads, ZnS microbeads, or glass microbeads that may improve photo conversion efficiency of QD film 700.

In another embodiment, matrix material 710 may have low oxygen and moisture permeability, exhibit high photo- and chemical-stability, exhibit favorable refractive indices, and adhere to outer surfaces of QDs 600, thus providing an air-tight seal to protect QDs 600. In another embodiment, matrix material 710 may be curable with UV or thermal curing methods to facilitate roll-to-roll processing.

According to some embodiments, QD film 700 may be formed by mixing QDs 600 in a polymer (e.g., photoresist) and casting the QD-polymer mixture on a substrate, mixing QDs 600 with monomers and polymerizing them together, mixing QDs 600 in a sol-gel to form an oxide, or any other method known to those skilled in the art.

Example Embodiments of Luminescent Nanocrystal Phosphors or Nanostructures

Described herein are various compositions comprising nanocrystals, including luminescent nanostructures. The various properties of the luminescent nanostructures, including their absorption properties, emission properties and refractive index properties, may be tailored and adjusted for various applications.

The material properties of nanostructures may be substantially homogenous, or in certain embodiments, may be heterogeneous. The optical properties of nanocrystals may be determined by their particle size, chemical or surface composition. The ability to tailor the luminescent nanostructure size in the range between about 1 nm and about 15 nm may enable photoemission coverage in the entire optical spectrum to offer great versatility in color rendering. Particle encapsulation may offer robustness against chemical and UV deteriorating agents.

Luminescent nanostructures, for use in embodiments described herein may be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent nanostructures for use in embodiments described herein may be produced from any suitable material, including an inorganic material, and more suitably an inorganic conductive or semiconductive material. Suitable semiconductor materials may include those disclosed in U.S. patent application Ser. No. 10/796,832, and may include any type of semiconductor, including group II-VI, group III-V, group IV-VI and group IV semiconductors. Suitable semiconductor materials may include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

In certain embodiments, the luminescent nanostructures may comprise a dopant from the group consisting of a p-type dopant or an n-type dopant. The nanocrystals useful herein may also comprise II-VI or III-V semiconductors. Examples of II-VI or III-V semiconductor nanocrystals may include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent nanostructures, described herein may also further comprise ligands conjugated, cooperated, associated or attached to their surface. Suitable ligands may include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands may enhance the ability of the luminescent nanostructures to incorporate into various solvents and matrixes, including polymers. Increasing the miscibility (i.e., the ability to be mixed without separation) of the luminescent nanostructures in various solvents and matrixes may allow them to be distributed throughout a polymeric composition such that the nanocrystals do not aggregate together and therefore do not scatter light. Such ligands are described as "miscibility-enhancing" ligands herein.

In certain embodiments, compositions comprising luminescent nanostructures distributed or embedded in a matrix material are provided. Suitable matrix materials may be any material known to the ordinarily skilled artisan, including polymetic materials, organic and inorganic oxides. Compositions described herein may be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting nanocrystals (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan may be used to create nanocrystals (luminescent nanostructures), a solution-phase colloidal method for controlled growth of inorganic nanomaterial phosphors may be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," *J. Am. Chem. Soc.* 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," *J Am. Chem. Soc.* 115: 8706 (1993), the disclosures of which are incorporated by reference herein in their entireties. This manufacturing process technology leverages low cost processability without the need for clean rooms and expensive manufacturing equipment. In these methods, metal precursors that may undergo pyrolysis at high temperature are rapidly injected into a hot solution of organic surfactant molecules. These precursors may break apart at elevated temperatures and react to nucleate nanocrystals. After this initial nucleation phase, a growth phase may begin by the addition of monomers to the growing crystal. The result may be freestanding crystalline nanoparticles in solution that may have an organic surfactant molecule coating their surface.

Utilizing this approach, synthesis may occur as an initial nucleation event that takes place over seconds, followed by crystal growth at elevated temperature for several minutes. Parameters such as the temperature, types of surfactants present, precursor materials, and ratios of surfactants to monomers may be modified so as to change the nature and progress of the reaction. The temperature controls the structural phase of the nucleation event, rate of decomposition of precursors, and rate of growth. The organic surfactant molecules may mediate both solubility and control of the nanocrystal shape. The ratio of surfactants to monomer, surfactants to each other, monomers to each other, and the individual concentrations of monomers may strongly influence the kinetics of growth.

According to an embodiment, CdSe may be used as the nanocrystal material, in one example, for visible light down-conversion, due to the relative maturity of the synthesis of this material. Due to the use of a generic surface chemistry, it may also possible to substitute non-cadmium-containing nanocrystals.

In semiconductor nanocrystals, photo-induced emission arises from the band edge states of the nanocrystal. The band-edge emission from luminescent nanostructures competes with radiative and non-radiative decay channels originating from surface electronic states. X. Peng, et al., *J Am. Chem. Soc.* 30:7019-7029 (1997). As a result, the presence of surface defects such as dangling bonds provide non-radiative recombination centers and contribute to lowered emission efficiency. An efficient and permanent method to passivate and remove the surface trap states may be to epitaxially grow an inorganic shell material on the surface of the nanocrystal. X. Peng, et al., *J. Am. Chem. Soc.* 30:701 9-7029 (1997). The shell material may be chosen such that the electronic levels are type 1 with respect to the core material (e.g., with a larger bandgap to provide a potential step localizing the electron and hole to the core). As a result, the probability of non-radiative recombination may be reduced.

Core-shell structures may be obtained by adding organometallic precursors containing the shell materials to a reaction mixture containing the core nanocrystal. In this case, rather than a nucleation event followed by growth, the cores act as the nuclei, and the shells may grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell may be obtained when there is a low lattice mismatch between the two materials.

Example materials for preparing core-shell luminescent nanostructures may include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuP, CuCl, CuBr, CuI, $Si_3N_4$, $Ge_3N_4$, $Al_2O_3$, $(Al, Ga, In)_2 (S, Se, Te)_3$, AlCO, and shell luminescent nanostructures for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

As used throughout, a plurality of phosphors or a plurality of luminescent nanostructures means more than one phosphor or luminescent nanostructure (i.e., 2, 3, 4, 5, 10, 100, 1,000, 1,000,000, etc., nanocrystals). The compositions will suitably comprise phosphors or luminescent nanostructures having the same composition, though in further embodiments, the plurality of phosphors or luminescent nanostructures may be various different compositions. For example, the luminescent nanostructures may all emit at the same wavelength, or in further embodiments, the compositions may comprise luminescent nanostructures that emit at different wavelengths.

Luminescent nanostructures for use in the embodiments described herein may be less than about 100 nm in size, and down to less than about 2 nm in size and invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light may comprise light between about 435 nm and about 500 nm, green light may comprise light between about 520 nm and 565 nm and red light may comprise light between about 625 nm and about 740 nm in wavelength.

According to various embodiments, the luminescent nanostructures may have a size and a composition such that they absorb photons that are in the ultraviolet, near-infrared, and/or infrared spectra. The ultraviolet spectrum may comprise light between about 100 nm to about 400 nm, the near-infrared spectrum may comprise light between about 750 nm to about 100 µm in wavelength, and the infrared spectrum may comprise light between about 750 nm to about 300 µm in wavelength.

While luminescent nanostructures of any suitable material may be used in the various embodiments described herein, in certain embodiments, the nanocrystals may be ZnS, InAs, CdSe, or any combination thereof to form a population of nanocrystals for use in the embodiments described herein. As discussed above, in further embodiments, the luminescent nanostructures may be core/shell nanocrystals, such as CdSe/ZnS, InP/ZnSe, CdSe/CdS or InP/ZnS.

According to various embodiments, the luminescent nanostructures may include at least one population of luminescent nanostructures capable of emitting red light and/or at least one population of luminescent nanostructures capable of emitting green light upon excitation by a blue/UV light source. The luminescent nanostructure wavelengths and concentrations may be adjusted to meet the optical performance required. In other embodiments, the luminescent nanostructures phosphor material may comprise a population of luminescent nanostructures which absorb wavelengths of light having undesirable emission wavelengths, and reemit secondary light having a desirable emission wavelength. In this manner, the luminescent nanostructure films described herein may comprise at least one population of color-filtering luminescent nanostructures to further tune the BLU emission and to reduce or eliminate the need for color filtering.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

What is claimed is:

1. A backlight unit (BLU) of a display device, the BLU comprising:
    a light source;
    a quantum dot film, optically coupled to the light source, configured to absorb light from the light source and emit a processed light; and
    a radiation absorbing element optically coupled to the quantum dot film, wherein the radiation absorbing element comprises nanostructured materials that exhibit optical absorption properties and do not exhibit optical emission properties and wherein the radiation absorbing element is configured to tune a spectral emission width of the processed light received from the quantum dot film to output over 90% color gamut coverage of an RGB color space with less than 10% decrease in brightness level of the processed light.

2. The BLU of claim 1, wherein the RGB color space has chromaticity coordinates (0.56, 0.52), (0.06, 0.59), and (0.16, 0.13) for red, green, and blue primary colors.

3. The BLU of claim 2, wherein the radiation absorbing element is configured to absorb a wavelength or a range of wavelengths from the processed light to output over 90% color gamut coverage of the RGB color space.

4. The BLU of claim 1, wherein the radiation absorbing element comprises non-phosphor based material.

5. The BLU of claim 1, wherein:
    the quantum dot film comprises a matrix and barrier coated quantum dots disposed within the matrix; and
    the radiation absorbing element is disposed within the matrix.

6. The BLU of claim 1, wherein the radiation absorbing element comprises narrow band organic dye.

7. The BLU of claim 1, further comprising an optical cavity; and
    wherein the radiation absorbing element is disposed on a top surface of the optical cavity and the light from the light source is emitted out of the optical cavity through the top surface.

8. The BLU of claim 1, wherein the radiation absorbing element comprises:
    a first material having a first absorption property; and
    a second material having a second absorption property different from the first absorption property.

9. The BLU of claim 1, wherein the radiation absorbing element comprises:
    a first material configured to absorb a first wavelength of the processed light; and
    a second material configured to absorb a second wavelength of the processed light, the second wavelength being different from the first wavelength.

10. The BLU of claim 1, wherein the radiation absorbing element is disposed on a substrate that is disposed on the quantum dot film.

11. The BLU of claim 1, further comprising a light guide plate; and
    wherein the radiation absorbing element is disposed on a top surface of the light guide plate and the light from the light source is emitted out of the light guide plate through the top surface.

12. The BLU of claim 1, further comprising a reflector; and
    wherein the radiation absorbing element is disposed on a surface of the reflector.

13. The BLU of claim 1, wherein the quantum dot film comprises a plurality of quantum dots configured to emit red light.

14. The BLU of claim 1, wherein the quantum dot film comprises a plurality of quantum dots configured to emit green light.

15. The BLU of claim 1, wherein the quantum dot film comprises:
    a first plurality of quantum dots configured to emit red light; and
    a second plurality of quantum dots configured to emit green light.

16. The BLU of claim 1, wherein the quantum dot film comprises:
    a core-shell structure; and
    a barrier layer surrounding the core-shell structure.

17. A display device comprising:
    a backlight unit (BLU) comprising:
        an optical cavity having a top side, a bottom side, and side walls, wherein light from a light source is emitted out of the optical cavity through the top side,
        an array of light sources coupled to the optical cavity, and
        a quantum dot film, positioned within the optical cavity, configured to absorb light from the array of light sources and emit a processed light; and
        a radiation absorbing element positioned within the optical cavity, wherein the radiation absorbing element comprises nanostructured materials that exhibit optical absorption properties and do not exhibit optical emission properties and wherein the radiation absorbing element is configured to tune a spectral emission width of the processed light received from the quantum dot film to output over 90% color gamut coverage of an RGB color space with less than 10% decrease in brightness level of the processed light; and
    an image generating unit (IGU) coupled to the BLU, wherein the BLU is configured to transit the processed light to the IGU.

18. The display device of claim 17, wherein:
    the quantum dot film comprises a matrix; and
    the radiation absorbing element is embedded in the matrix.

19. The display device of claim 17, wherein the radiation absorbing element comprises:
    a first material configured to absorb a first wavelength of the processed light; and
    a second material configured to absorb a second wavelength of the processed light, the second wavelength being different from the first wavelength.

* * * * *